(12) United States Patent
Rajala et al.

(10) Patent No.: US 8,673,389 B2
(45) Date of Patent: Mar. 18, 2014

(54) PROCESS FOR CONTROLLING COATING DEPOSITION

(75) Inventors: Markku Rajala, Vantaa (FI); Juha Tikkanen, Tampere (FI)

(73) Assignee: Beneq Oy, Vantaa (FI)

( * ) Notice: Subject to any disclaimer, the term of this patent is extended or adjusted under 35 U.S.C. 154(b) by 0 days.

(21) Appl. No.: 13/392,237

(22) PCT Filed: Sep. 2, 2010

(86) PCT No.: PCT/FI2010/050685
§ 371 (c)(1),
(2), (4) Date: Mar. 30, 2012

(87) PCT Pub. No.: WO2011/027035
PCT Pub. Date: Mar. 10, 2011

(65) Prior Publication Data
US 2012/0189766 A1    Jul. 26, 2012

(30) Foreign Application Priority Data

Sep. 3, 2009    (FI) ...................................... 20090319

(51) Int. Cl.
*C23C 16/00*    (2006.01)
(52) U.S. Cl.
USPC .......................................... 427/8; 427/248.1
(58) Field of Classification Search
USPC .................................................. 427/8, 248.1
See application file for complete search history.

(56) References Cited

U.S. PATENT DOCUMENTS

| | | | |
|---|---|---|---|
| 4,072,767 A | 2/1978 | Suda et al. | |
| 6,342,265 B1 * | 1/2002 | Kelson et al. | 427/9 |
| 6,454,862 B1 * | 9/2002 | Yoshida et al. | 118/722 |
| 6,737,666 B1 | 5/2004 | Ito et al. | |
| 2002/0025388 A1 * | 2/2002 | Bhardwaj et al. | 427/569 |
| 2002/0100416 A1 | 8/2002 | Sun et al. | |
| 2005/0220994 A1 * | 10/2005 | Mehta et al. | 427/180 |
| 2006/0019024 A1 * | 1/2006 | Freeman et al. | 427/8 |
| 2006/0132769 A1 | 6/2006 | Iwa et al. | |
| 2006/0156791 A1 | 7/2006 | Tikkanen et al. | |
| 2007/0056395 A1 * | 3/2007 | Bae et al. | 73/865.5 |
| 2007/0261740 A1 | 11/2007 | Otsuki et al. | |
| 2007/0281105 A1 * | 12/2007 | Mokhlesi et al. | 427/569 |
| 2008/0124453 A1 | 5/2008 | Bour et al. | |
| 2009/0104369 A1 * | 4/2009 | Rajala et al. | 427/475 |
| 2010/0244855 A1 * | 9/2010 | Agache et al. | 324/634 |

FOREIGN PATENT DOCUMENTS

| | | |
|---|---|---|
| EP | 0 196 806 A1 | 10/1986 |
| EP | 2 192 091 A1 | 6/2010 |
| JP | A-05-025614 | 2/1993 |

OTHER PUBLICATIONS

Svrcek, V., et al., "Monitoring the chemical vapor deposition growth of multiwalled carbon nanotubes by tapered element oscillating microbalance". The Journal of Chemical Physics 124, 184705 (2006), pp. 1-12.*
Kim, T., et al., "Particle formation during low-pressure chemical vapor deposition from silane and oxygen: Measurement, modeling, and film properties". J. Vac. Sci. Technol. A 20(2), Mar./Apr. 2002, pp. 413-423.*
Keskinen et al., "Effect of silver addition on the formation and deposition of titania nanoparticles produced by liquid flame spray," *Journal of Nanoparticle Research*, vol. 9, pp. 569-588, 2007.
Nijhawan et al., "Particle transport in a parallel-plate semiconductor reactor: Chamber modification and design criterion for enhanced process cleanliness," *J. Vac. Sci. Technol. A*, vol. 18, No. 5, pp. 2198-2206, Sep./Oct. 2000.
Rao et al., "Investigation of particle formation during the plasma enhanced chemical vapor deposition of amorphous silicon, oxide, and nitride films," *J. Vac. Sci. Technol. B*, vol. 16, No. 2, pp. 483-489, Mar./Apr. 1998.
Aromaa et al., "The effect of process parameters on the Liquid Flame Spray generated titania nanoparticles," *Biomolecular Engineering*, vol. 24, No. 5, pp. 543-548, 2007.
Pimenoff et al., "Nanostructured coatings by liquid flame spraying," *Thin Solid Films*, vol. 517, No. 10, pp. 3057-3060, Mar. 2009.
Finnish Search Report issued in Application No. 20090319; Dated Jun. 11, 2010 (With Translation).
International Search Report issued in Application No. PCT/FI2010/050685; Dated Feb. 8, 2011.
Oct. 31, 2013 Extended European Search Report issued in European Application No. 10813392.7.

* cited by examiner

*Primary Examiner* — Bret Chen
(74) *Attorney, Agent, or Firm* — Oliff PLC

(57) ABSTRACT

A method and apparatus for controlling a vapor deposition based coating process, including monitoring ultrafine particles, and adjusting at least one process parameter based on the monitoring. During at least one stage of the coating deposition process, at least one of the coating precursors includes a gas, a vapor, or an aerosol.

13 Claims, 2 Drawing Sheets

PROCESS FOR CONTROLLING COATING DEPOSITION

BACKGROUND OF THE INVENTION

The invention relates to a process for controlling coating deposition on different substrates. The invented method is based on monitoring ultrafine particles and on the adjustment of one or several process parameters based on the monitoring. The invention further relates to an apparatus for controlling coating deposition on different substrates.

FIELD OF INVENTION

Various coating processes exist for the production of different coatings on different substrates. In a large group of coating processes at least a portion of the material to be deposited or its precursors is at some stage of the process in a gaseous, vapour or aerosol form, aerosol referring to a mixture of gas and particles which comprise solid or liquid phase or a mixture of thereof.

Chemical vapor deposition (CVD) process is frequently used in the production of coatings on different substrates, such as metal, ceramics or glass. In the CVD process, precursor compounds are vaporized in a reactor that spreads the resulting gas mixture uniformly over the substrate. Reaction in the gas phase happens at the proximity of a hot surface. Both gases and liquids can be fed to the reactor. There are various alternatives of the CVD process including e.g. plasma enhanced CVD (PECVD), aerosol assisted CVD (AACVD), combustion CVD and modified CVD (MCVD). The CVD process works both in atmospheric pressure and in vacuum. In the glass manufacturing processes atmospheric CVD process (APCVD) is generally applied. In the flat glass industry, CVD can be used either in on-line systems, e.g. in float lines or in off-line systems, either in separate coating systems or integrated to glass processing lines, e.g. in glass tempering lines. The coatings produced by the CVD process include, but are not limited to, infrared reflective coatings for low-e and solar control glazing, antireflective coatings, self-cleaning and hydrophilic coatings, transparent conductive oxide coatings for photovoltaic applications.

Atomic layer deposition (ALD) is a thin film deposition technique that is based on the sequential use of a gas phase chemical process. The majority of ALD reactions use two chemicals, typically called precursors. These precursors react with a surface one-at-a-time in a sequential manner. By exposing the precursors to the growth surface repeatedly, a thin film is deposited.

In the spray-pyrolysis process precursors are atomized into droplets and directed on the surface of glass to be coated for producing a coating. The spray gun typically produces a mist, i.e. droplets with the mean droplet size around 100 μm. The problem in the spray pyrolysis coating process is the slow growth rate of the coating, which is due to fact that the liquid droplets brought to the surface of the glass produce a liquid film on the surface of the glass. The pyrolization and vaporization of the liquid film is slow. The slow growth rate limits the utilization of this coating process in many applications In the nAERO®, Beneq Oy, Finland, process the coating precursors are atomized into the deposition chamber as liquid droplets having a typical mean droplet diameter (based on number concentration) of less than 10 micrometers and preferably less than 3 micrometers, and thus an aerosol (a mixture of liquid particles and gas) is formed. The droplets are directed towards the surface of the glass substrate to be coated. The glass substrate is brought to the coating process in such a temperature that the thermal energy of the glass substrate is able to vaporize the droplets substantially close to the surface of the glass substrate before the droplets contact with the surface. Thus the precursor feeding resembles spray pyrolysis but the coating growth resembles CVD. The advantage of the nAERO process is that it combines the advantages of spray pyrolysis and CVD such that an improved coating process is achieved. The nAERO process can be applied either on-line or off-line.

Physical vapor deposition (PVD) is a general term used to describe any of a variety of methods to deposit thin films by the condensation of a vaporized form of the material onto various surfaces. The coating method involves purely physical processes such as high temperature vacuum evaporation or plasma sputter bombardment rather than involving a chemical reaction at the surface to be coated as in chemical vapor deposition.

Pulsed laser deposition (PLD) is a PVD technique where a high power pulsed laser beam is focused inside a vacuum chamber to strike a target of the material that is to be deposited. This material is vaporized from the target (in a plasma plume) which deposits it as a thin film on a substrate. This process can occur in ultra high vacuum or in the presence of a background gas, such as oxygen which is commonly used when depositing oxides to fully oxygenate the deposited films.

Thermal spraying can provide thick coatings (approx. thickness range is 20 micrometers to several mm, depending on the process and feedstock), over a large area at a high deposition rate. Coating materials available for thermal spraying include metals, alloys, ceramics, plastics and composites. They are fed in powder or wire form, heated to a molten or semimolten state and accelerated towards substrates in the form of micrometer-size particles. Combustion or electrical arc discharge is usually used as the source of energy for thermal spraying. Resulting coatings are made by the accumulation of numerous sprayed particles. The surface may not heat up significantly, allowing the coating of flammable substances.

DESCRIPTION OF THE STATE OF THE ART

Generally speaking, the rate and efficiency of the different coating processes are dependent on various factors, such as heat and mass transfer in the coating zone. The reactions of the CVD-type processes are often complicated and the process is very difficult to monitor and control by any feedback controls. Thus modeling, especially computational fluid dynamics (CVD) models are often used to simulate the flow, thermal and kinetic phenomena. Based on the simulation and on the experience, the deposition parameters are then set to suitable and safe values.

The precursor usage efficiency of the CVD process is generally poor. One of the reasons for the poor efficiency is that no gas-phase reactions are usually allowed in the CVD process. The gas-phase reactions in the CVD process produce ultrafine particles, which may be deposited on the coating decreasing the quality of the coating. As the glass coating are tightly specified, e.g. as in the standard ASTM 1376-03, deposited particles may cause loss of production.

The particles produce light scattering, often called haze. Although haze is generally a unwanted phenomena in the coating, it is a desirable property is some glasses used in photovoltaic applications. Thus the control of haze in glass coatings is one of the key parameters for the CVD coated glass objects.

In the ALD process particles are generally not allowed. The sequential process generally involves a purging step between the different precursor cycles in order to prevent unwanted particle formation. As the size of the ALD reactor grows it is essential to be able to shorten the cycle times, including the purging cycle.

In the PVD processes it would be of advantage to be able to monitor the particle formation in the process, especially for ultrafine particles, to be able to receive data on the process performance.

There is currently no direct control method for controlling the coating processes where the precursor or the reaction product is at some stage of the process in gaseous, vapour or aerosol form, by using the data from the measurement of the particles born in the coating process. Thus there exists a need for such a direct control method

SUMMARY OF THE INVENTION

The aim of the current invention is to introduce a method which solves the problems of the prior art.

The invented method for controlling a coating deposition process can be used in such coating processes where at least at one stage of the coating deposition process at least one of the coating precursors comprises a gas, a vapour or an aerosol. The method comprises monitoring ultrafine particles and adjusting at least one process parameter based on the monitoring.

The coating deposition process can be e.g. a chemical vapor deposition (CVD) process, nAERO® process, combustion deposition process, or atomic layer deposition (ALD) process.

In the CVD, nAERO or combustion deposition process the particle monitoring result may be used to adjust e.g. the precursor mixture concentration, at least one precursor temperature or the flow of at least one precursor or additional material, such as an additional gas or vapor.

In the ALD process the particle monitoring signal may be used e.g. to adjust the materials flows, temperatures, pressures and pulsing times (e.g. the length of the purging cycle).

The particle monitoring signal may in various coating processes be used to adjust the temperature of at least a portion of the reactor chamber.

The invented method may be used e.g. in the production of essentially haze-free or in the production of hazy transparent oxide coatings on glass. Such coatings are required e.g. in the production of photovoltaic modules or in the production of energy-efficient glazing.

The invention also comprises an apparatus for controlling a coating deposition process, where the apparatus comprises means (13) for monitoring ultrafine particles and means (14) for adjusting at least one process parameter based on the monitoring.

The invented method is based on the measurement of at least ultrafine particles preferably at the exhaust of the coating deposition chamber and using at least one measurement signal to tune at least one process parameter of the coating process.

Another aim of the current invention is to introduce a method for controlling the CVD process. The invented method is based on the measurement of at least ultrafine particles preferably at the exhaust of the CVD deposition chamber and using at least one measurement signal to tune at least one process parameter of the CVD process.

Yet another aim of the current invention is to introduce a method for controlling the ALD process. The invented method is based on the measurement of at least ultrafine particles preferably at the exhaust of the ALD deposition chamber, preferably during the deposition cycles for at least one precursor or during the purging cycle, and using at least one measurement signal to tune at least one process parameter of the ALD process.

Yet another aim of the current invention is to introduce a method for controlling the spray pyrolysis (SP) deposition process. The invented method is based on the measurement of at least ultrafine particles preferably at the exhaust of the SP deposition chamber and using at least one measurement signal to tune at least one process parameter of the SP process.

Yet another aim of the current invention is to introduce a method for controlling the nAERO process. The invented method is based on the measurement of at least ultrafine particles preferably at the exhaust of the nAERO deposition chamber and using at least one measurement signal to tune at least one process parameter of the nAERO process.

Yet another aim of the current invention is to introduce a method for controlling the PVD process. The invented method is based on the measurement of at least ultrafine particles preferably at the exhaust of the PVD deposition chamber and using at least one measurement signal to tune at least one process parameter of the PVD process.

Yet another aim of the current invention is to introduce a method for controlling the thermal spraying (TS) process. The invented method is based on the measurement of at least ultrafine particles preferably at the exhaust of the TS deposition chamber and using at least one measurement signal to tune at least one process parameter of the TS process.

Ultrafine particles are defined as particles having a mean diameter of less than 100 nm. Such particles are produced e.g. in the production of tin oxide coatings from monobutyltin-trichloride ($n\text{-}C_4H_9SnCl_3$, MBTC), especially if the temperature of the gas exceeds 500° C. In addition to the ultrafine particles, generally referred as 'nuclei mode' particles, larger particles, called 'accumulation mode' particles may exist in the CVD process.

Ultrafine particles cannot be monitored or measured using conventional optical instruments. The use of an ultrafine particle measurement unit in process control requires that the measurement apparatus works essentially continuously and measures ultrafine particles in real-time. An example of such a measurement device is the electrical low pressure impactor, ELPI™ produced e.g. by Dekati Oy, Finland. In ELPI™ the well-known impactor technology is combined with particle charging and electrical detection. The result is a robust instrument to measure particle size distribution in a wide size and concentration range, accurately and in real-time. The ELPI™ can also be used to measure particle charge distribution in real-time, and make gravimetric impactor measurements.

ELPI is, however, complicated measurement equipment which requires frequent cleaning and maintenance.

A preferred method for monitoring the particle concentration in the coating deposition exhaust uses efficient mixing of particle-containing and charged clean gas in an ejector. The main flow of the ejector consists of essentially clean ionized gas flow. The phrase 'essentially clean' means that the particle concentration in the ionized gas is so low that it does not adversely affect the monitoring process. The speed of the clean air is preferably sonic or close to sonic, however lower speeds can be utilized as well. The main flow causes suction to the side flow channel and thus a sample flow from the particle-containing gas is sucked to the monitoring apparatus. The ionized clean gas forms the main flow and the sample flow forms the side flow. The main flow should advantageously be as small as possible. The efficient mixing makes it possible to design small measurement apparatuses with fast response time, which is a great advantage for the coating process control.

An ejector is efficient in mixing the main flow and the side flow, especially with swirling main flow. In the ejector the main and side flows are advantageously fed close to each other which greatly improves mixing homogeneity and rate. For efficient measurement it may be advantageous to switch or modulate the mean flow thus carrying out the measurement in AC-mode rather than in DC-mode.

The ions that are not attached to the particles have to be removed after the mixing. The ions are removed by an ion trap; the removal mechanism being either electrical or magnetic field or diffusion, these mechanisms can also be combined. The nuclei mode particles can also be trapped to the ion trap, if the trap voltage is increased to a suitable value, the absolute voltage depending e.g. on the geometry of the ion trap, gas flow speed, etc. The size of the trapped particles can be further increased by increasing the trap voltage. Thus it is possible to carry out the trapping with e.g. three different voltages which provides an indication on the size distribution of the accumulation mode particles which can be advantageously used in estimating e.g. the mass or number concentrations. Measuring the electrical current corresponding to different ion trap voltages allows the estimation of various parameters of the nuclei mode and the accumulation mode, like the particle concentration and the mean particle size. The ion trap voltage can be either switched or modulated between at least two different voltages.

Especially when monitoring hot gas flows, like exhaust gases of the CVD process, the particle concentration may change in the measurement apparatus as well as the cooling gas generates nuclei mode particles. As explained above, the ion trap can be adjusted to a high enough voltage to trap these nuclei mode particles and thus the particles formed in the measurement apparatus itself do not adversely affect the measurement result.

A preferred embodiment for ionizing the clean gas is to use a corona discharger. The clean gas is advantageously fed with high speed from the close vicinity of the corona discharger so that the corona needle or equivalent is protected by the clean gas flow. The high-speed gas flow also increases ion production compared to a free-space corona discharging and decreases ion losses to the apparatus walls etc.

Clean gas ionization can also be carried out by sparking, thermal emission, surface charging or ionizing radiation.

The electrical charge carried by the particles is monitored by measuring the electrical current escaping with the particles. This current measurement method is known from the prior art and with the current invention it provides a benefit by removing the need of capturing the charged particles.

The measurement signal obtained from the particle measurement is used in a coating process to control one or several of the process parameters. These process parameters comprise the precursor flows, additional gas flows, precursor and gas temperatures, exhaust pressure, etc.

BRIEF DESCRIPTION OF THE DRAWINGS

In the following, the invention will be described in more detail with reference to the appended principle drawing, in which.

For the sake of clarity, the figure only shows the details necessary for understanding the invention. The structures and details which are not necessary for understanding the invention and which are obvious for a person skilled in the art have been omitted from the figure in order to emphasize the characteristics of the invention.

DETAILED DESCRIPTION OF PREFERRED EMBODIMENTS

The following description describes the invention with the CVD embodiment. However, as understood by a person skilled in the art, a similar description would be applicable for similar processes such as spray pyrolysis deposition or nAERO deposition processes.

Figure 1:
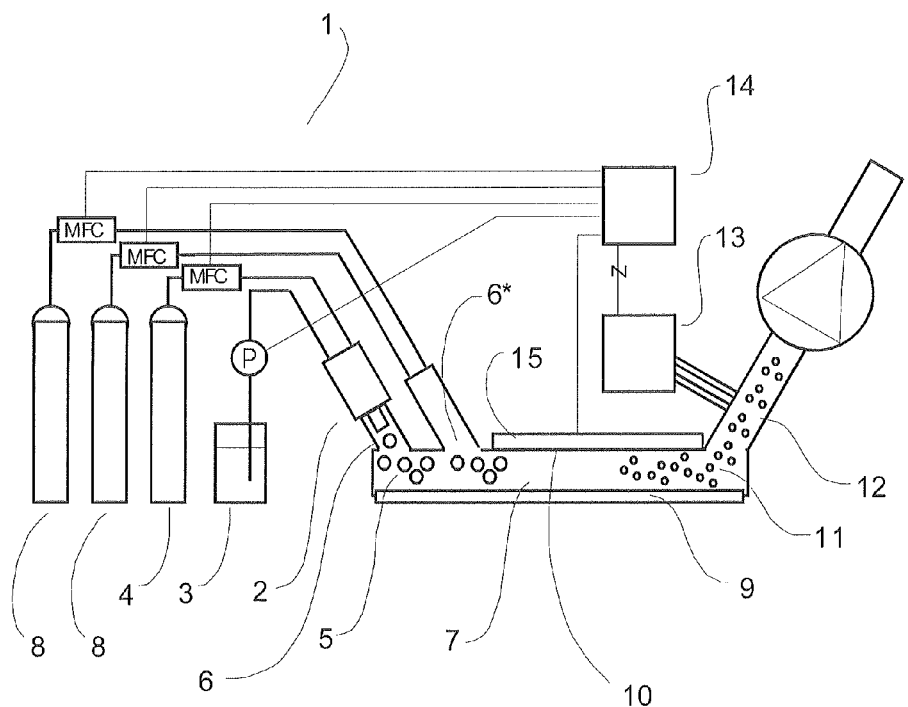
FIG. 1 shows an embodiment which clarifies the invented method showing the use of the method in transparent conductive oxide film manufacturing by the CVD process.

FIG. 1 shows an aerosol assisted CVD equipment 1, which includes means 2 for atomizing a precursor liquid 3, the atomizing preferably taking place by a two-fluid atomizer, where the velocity difference between the precursor liquid 3 flow and the atomizing gas 4 flow generates the droplets 5. The droplets 5 are fed through slot 6 into the CVD reaction chamber 7 where they evaporate. Additional gases 8 which may or may not take part in the film formation reaction are fed to the reaction chamber 7 through slot 6*. In the production of tin oxide based transparent conductive oxide coatings on glass 9 the liquid source is a tin-containing precursor, preferably monobutyltintrichloride (n-$C_4H_9SnCl_3$, MBTC), which reacts with water vapor and oxygen producing tin oxide, ethane and hydrogen chloride, $C_4H_9SnCl_3+H_2O+½O_2=SnO_2+C_2H_4+3HCl$. As the precursor 3 and the gases 4 and 8 propagate in chamber 7 they heat up due to the heat transfer between the gases/vapors and the chamber walls 10 and the glass 9. If the gases/vapors are heated above a certain threshold limit, typically around 300° C., tin oxide or intermediate solid product producing reactions start to take place in the gas phase resulting to the generation of nuclei mode, i.e. ultrafine particles 11. If these particles 11 stay a long time in the reaction chamber 7 (i.e. the propagation speed of the gas/vapor in the chamber is low), also accumulation mode particles may exist in the chamber. The particles follow the gas stream to the chamber exhaust 12. A particle sensor 13, measuring at least ultrafine particles, is in contact with the exhaust 12 so that a sample flow flows through the particle sensor 13. The particle sensor 13 is preferably based on particle charging and current measurement, because these particle sensors primarily measure the particle surface area and are thus sensitive to ultrafine particles. At least one measurement signal is fed to the control unit 14. Based on the measured value, the control unit 14 adjusts at least one process parameter. The control unit may control e.g. the precursor 3 flow controlling the pump P, the atomizing gas 4 flow controlling the mass flow controller MFC, the additional gas 8 flow controlling the mass flow controller MFC, the precursor 4 temperature, the atomizing gas 4 temperature, the additional gas 8 temperature, at least a part of the reaction chamber 7 surface temperature controlling a heating block 15, the exhaust 12 pressure or other parameters relevant to particle production in the gas phase. For example, if unwanted particles are monitored in the chamber exhaust, the control unit may increase the volumetric flow of additional gas 8, thus reducing the residence time in the chamber which reduces particle formation in the gas phase. Increasing the temperature of the gas or chamber surfaces will increase particle formation, decreasing the exhaust pressure will decrease particle formation and so on.

If a hazy coating is desired then it may be beneficial to increase particle formation in the reaction chamber. Thus adjustments to the process parameters contradictory to the ones described above are required.

As described above, the ALD coating deposition involves a purging cycle between the precursor cycles. E.g. to fabricate glass products with improved strength the glass substrates were placed in a reaction chamber of a Beneq TFS500 atomic layer deposition (ALD) reactor. The dimensions of the glass substrates 1 were 25.4 mm×76.2 mm×1.2 mm. The glass substrates were coated with aluminium oxide by alternately exposing the substrates to gaseous trimethylaluminium (TMA) and water precursors. An essentially inert carrier gas was utilized to transport the precursor vapours into the reaction chamber from their respective sources. The pulse (exposure) times for TMA and water were 1.2 s and 0.8 s, respectively. After each precursor pulse a purging period was used to purge the reaction space from this precursor with the carrier gas, for a following precursor pulse (exposure). These pulse times and the purging periods were sufficiently long to enable essentially uniform and conformal film growth through self-limiting surface reactions. Temperature of the reaction chamber of the ALD reactor was about 200° C., i.e. significantly below the glass transition (softening) temperature for the microscope glasses. The total thickness of the grown aluminium oxide coating was about 20 nm, which was obtained by 180 growth cycles (or ALD cycles) in the prevailing process conditions. Thickness variation of the coating was measured to be below 3% on one glass substrate. After at least one precursor deposition cycle, such as the TMA cycle or during the purging cycle, the exhaust gases are passed through the particle sensor 13 and the output signal of the particle sensor 13 can be used to control the length of the purging cycle.

Figure 2:
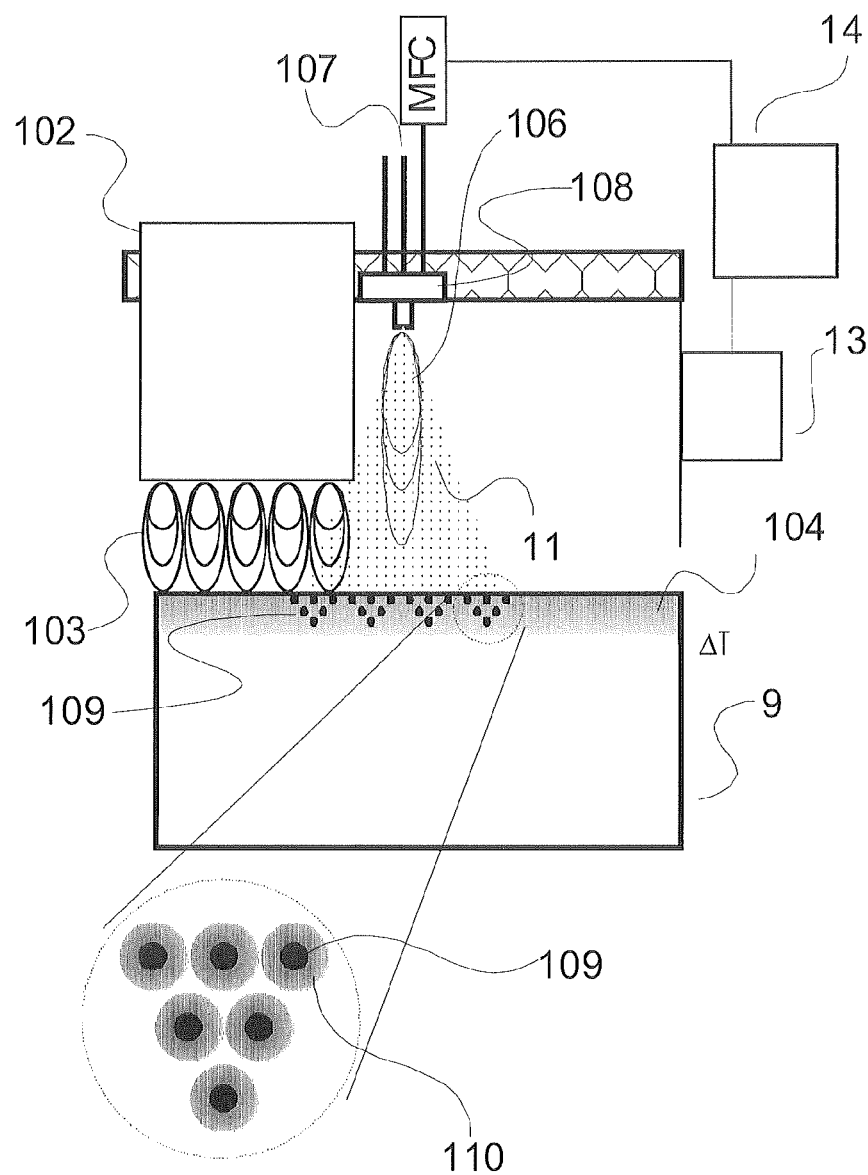
FIG. 2 shows an embodiment which clarifies the invented method showing the use of the method in glass surface modification by a combustion deposition process.

The term 'coating' should within the scope of this invention be understood also as surface modification which may be carried out by the coating material. FIG. 2 shows an embodiment of the invention where the invented method is used to control a combustion deposition process. The surface of a glass product 9 is heated by a gas burner 102, which directs a convectively heating flow 103 to the surface of glass 9. Consequently, the glass product 9 is provided with a thermal gradient ΔT, on account of which the surface of the glass product 9 is provided with a layer 104 having a changing viscosity. Fine particles 11 whose diameter is preferably less than 1 micrometer, more preferably less than 300 nanometers, and most preferably less than 100 nanometers, are conveyed to the layer 104. The fine particles 11 are produced e.g. by a spraying method disclosed in Finnish Patent FI98832 by utilizing a liquid flame spraying apparatus 108 wherein fine particles are produced from liquid and gaseous raw materials 107 by means of a flame 106. The fine particles 11 penetrate into the surface layer 104 of the glass product 9 having a changing viscosity and move therein due to the influence of the Brownian motion, forming a layer consisting of fine particles 109. From the fine particles 109 of the particular layer, a material 110 dissolves and diffuses in the layer 104 of the glass product 101 to be modified. Upon cooling down, the layer 104 solidifies, thereby providing the surface of the glass product with a steplessly changing layer. It is preferable to heat the surface of the glass product 9 convectively, because convective heat transfer mainly heats the surface layer 104 of the glass product 9, thus providing a glass layer with a steplessly changing viscosity. However, it is obvious to those skilled in the art that the surface of the glass product may also be heated using thermal radiation. Most preferably, the surface of the product is heated by gas burners arranged substantially perpendicularly to the surface, most effectively by using hydrogen gas as a fuel and oxygen as an oxidizing gas. From the fine particles 109, the material 110 is diffused and dissolved in the glass surrounding the particles. However, the maximum amount of the material 110 that can become dissolved is determined by the solubility limit of the liquid 104 for the material 109. In addition, dissolution and diffusion are phenomena dependent on time t, and if the glass 104 solidifies before all the material 110 has been dissolved from the fine particle 109, a colloidal particle remains inside the material. Thus in all cases it is beneficial to be able to control the process parameters, such as the precursor feed rate based on the measurement results obtained from the particle sensor 13. In the preferred embodiment the control unit 14 adjusts the mass flow of the precursor comprising the metal-containing precursor for the production of the particles 11.

It is possible to produce various embodiments of the invention in accordance with the spirit of the invention. Therefore, the above-presented examples must not be interpreted as restrictive to the invention, but the embodiments of the invention can be freely varied within the scope of the inventive features presented in the claims.

The invention claimed is:

1. A method for controlling a vapor deposition based coating process, comprising:
   monitoring ultrafine particles by using particle charging and electrical detection; and
   based on the monitoring, adjusting on-line at least one process parameter affecting particle formation,
   wherein the monitoring comprises measuring a concentration of the ultrafine particles by taking a sample flow, mixing the sample flow with essentially clean, charged gas, and measuring an electrical current carried by the ultrafine particles.

2. The method of claim 1, wherein the measuring of the electrical current carried by the ultrafine particles comprises measuring the electrical current escaping with charged ultrafine particles without capturing the charged ultrafine particles.

3. The method as in claim 1, wherein the vapor deposition based coating process is a chemical vapor deposition (CVD) process.

4. The method of claim 3, wherein the vapor deposition based coating process is an atmospheric, aerosol-assisted chemical vapor deposition process.

5. The method as in claim 1, wherein the vapor deposition based coating process is an atomic layer deposition (ALD) process.

6. The method of claim 5, wherein the atomic layer deposition process includes a purging cycle between different precursor cycles, and the monitoring of the ultrafine particles comprises measuring the concentration of the ultrafine particles during at least one precursor cycle.

7. The method as in claim 5, wherein the atomic layer deposition process includes a purging cycle between different precursor cycles, and the monitoring of the ultrafine particles comprises measuring the concentration of the ultrafine particles during the purging cycle.

8. The method of claim 5, further comprising adjusting a length of a purging cycle of the vapor deposition based coating process based on the measured concentration of the ultrafine particles.

9. The method as in claim 1, further comprising adjusting a concentration of a precursor mixture based on a signal obtained by the monitoring of the ultrafine particles.

10. The method as in claim 1, further comprising adjusting at least one precursor temperature of the vapor deposition based coating process based on the measured concentration of the ultrafine particles.

11. The method of claim 1, further comprising adjusting a temperature of at least a portion of a surface of a reactor chamber based on the measured concentration of the ultrafine particles in the reactor chamber.

12. The method of claim 1, wherein the method is used in the production of essentially haze-free coatings on glass.

13. The method of claim 1, wherein the method is used in the production of hazy transparent oxide coatings on glass.

* * * * *